United States Patent [19]

Coffey et al.

[11] Patent Number: 4,763,404

[45] Date of Patent: Aug. 16, 1988

[54] LOW CURRENT SUPERCONDUCTING MAGNET WITH QUENCH DAMAGE PROTECTION

[75] Inventors: David M. Coffey, Knox County; Robert W. McGhee, Campbell County; David L. Coffey, Anderson County, all of Tenn.

[73] Assignee: Cryomagnetics, Inc., Oak Ridge, Tenn.

[21] Appl. No.: 23,839

[22] Filed: Mar. 9, 1987

[51] Int. Cl.$^4$ ........................ H01L 39/24; H01B 17/14

[52] U.S. Cl. .................................... 29/599; 174/15 S; 174/125.1

[58] Field of Search ........... 29/599; 174/15 S, 15 CA, 174/128 S

[56] References Cited

U.S. PATENT DOCUMENTS

| | | | |
|---|---|---|---|
| 4,189,693 | 2/1980 | Satti . | |
| 4,254,299 | 3/1981 | Horvath et al. | 29/599 X |
| 4,271,585 | 6/1981 | Satti . | |

*Primary Examiner*—Timothy V. Eley
*Assistant Examiner*—Carl J. Arbes
*Attorney, Agent, or Firm*—Pitts and Brittian

[57] ABSTRACT

A low current superconducting magnet, and a method of fabrication, having improved protection against quench damage. The magnet utilizes the technique of forming a twisted cable of a plurality of substantially parallel superconductor wires and then winding this cable in turns to form the desired magnet configuration. A curable potting material such as an epoxy is applied during winding so as to substantially fill all interstices between the wires. After winding the ends of the wires are connected so as to put each wire in a series array. The intermixing of the wires throughout the magnet winding, together with the heat transfer characteristics of the potting material, provides for many parallel paths for heat conduction to a cryogenic fluid to reduce potential thermal damage. Furthermore, a voltage limiting device, such as a diode pair, is connected across the adjacent ends of each wire. A magnet is described that produces a field in excess of one tesla with about ten amperes of current and that will withstand a quench from operating conditions. Superconductor wires of about 0.004 in. in diameter are utilized.

13 Claims, 1 Drawing Sheet

LOW CURRENT SUPERCONDUCTING MAGNET WITH QUENCH DAMAGE PROTECTION

DESCRIPTION

1. Technical Field

This invention relates to superconducting magnets, and more particularly to a method of producing a superconducting magnet which will produce very high magnetic fields with very low current, the resultant magnet being provided with improved quench protection. The invention also embraces a magnet produced by the method.

2. Background Art

Superconducting magnets are those magnets fabricated or selected winding materials that, when operated at cryogenic temperatures, exhibit essentially zero resistance to the flow of current. Accordingly, magnetic fields can be produced and maintained with considerably less power than required for magnets of conventional construction.

Whenever any portion (or all) of a superconducting magnet is quenched, i.e. becomes resistive rather than superconducting, a large amount of energy must be dissipated. This released energy can create extreme heating conditions at the point where such a quench initiates. The heating problem is normally addressed by preventing localized concentration of the heat coupled with a transfer of heat to the cryogenic fluid.

Typically, superconducting magnets of the prior art for producing fields of about eight tesla or more require currents of at least fifty (50) amperes. More often, a current of several hundred amperes has been required for superconducting magnets. Even the lowest of these currents requires a sizable current source and sizable power cables leading to the magnet thus increasing the heat load on the crygenic system. There are many applications for a superconducting magnet where even a minimum of these conditions are very detrimental to the efficiency of the system. For example, it is desired that superconducting magnets for space applications use much smaller currents without sacrificing the achievable magnetic fields. This would significantly reduces the size of power supplies as well as reduces the load on any cryogenic system needed to achieve the required lowered temperatures for superconductivity.

Although a superconducting magnet operating at low current has been desired, no satisfactory method has been achieved to practically fabricate the same to retain satisfactory quench properties. In order to use small currents, the wire for the magnets must be small and thus has poor mechanical strength. Furthermore, if localized heating occurs it can be more damaging to a small winding than a larger winding as normally used. Also, a low current magnet to produce high fields necessitates a very large number of winding turns and thus is laboriously fabricated.

One approach to the matter of increasing the ease of winding for a superconducting magnet is described in U.S. Pat. Nos. 4,189,693 and 4,271,585 issued to J. A. Satti on Feb. 19, 1980, and June 9, 1981, respectively. According to Satti, a plurality of matrixed superconducting wires are twisted to form a cable, with each wire insulated from another. The cable is then shaped into a rectangular cross section and wound with a tape in an open spiral to create cooling channels. Opposite ends of the composite unit are then connected at one place to wire them in series. Anywhere from five to twenty-three wires (an odd number is required according to the patents) are used to make the cable so that the number of winding turns is reduced by a factor of five to twenty-three. Satti relies upon cooling, connection of strands in one layer with strands in another, and even a non-superconducting wire to assist in rapid quenching to minimize damage due to heat that is produced. The magnets of Satti, however, are designed for several hundred amperes of current and therefore not suitable for space and similar applications.

Accordingly, it is a principal object of the present invention to provide a method of practically producing a superconducting magnet to produce large magnetic fields with very small currents, e.g. ten amperes or less for fields of one tesla or greater.

Another object of the present invention is to provide a method of producing a superconducting magnet wherein the problems of voltage spikes during quench are accomodated in a series type system.

A further object of the present invention is to provide a method of producing a superconducting magnet wherein a parallel path is produced for the conduction of heat produced by a quench so that the time of quench is substantially reduced and localized heating is minimized.

These and other objects will become more apparent upon a consideration of the drawings and the detailed description which follow.

DISCLOSURE OF THE INVENTION

In accordance with the features of the present invention, there is provided a method for producing a low current, high field superconducting magnet and the resultant magnet produced by that method. A plurality of small wires of a material exhibiting superconducting properties at cryogenic temperatures are twisted to form a cable, with this cable then wound into a desired configuration and number of turns. Interstices within the spaces between wires and turns of the cable are filled during winding with an appropriate potting material, e.g. plastic, to prevent any movement of wires during use. Ends of the wires are connected serially at the ends of the winding so that the number of wires per cable times the numbers of turns of the cable establishes the total number of wire turns making up the magnet. Protection is provided at the point of each wire juncture to minimize any voltage spike across each wire of the magnet during a quench. Thus, the intimate bonding provides for parallel paths to dissipate heat quickly throughout the magnet from any source of heat generation during a quench, and the voltage spikes are minimized by series-type protection. As a result, a magnet operating at a few amperes is protected from damage even though operating at extremely high magnetic fields.

BEST MODE FOR CARRYING OUT THE INVENTION

As stated above, the present invention is a method of producing a low current, high field superconducting magnet and the resultant magnet which exhibits improved resistance to damage caused during a quench of the magnet.

Figure 1:
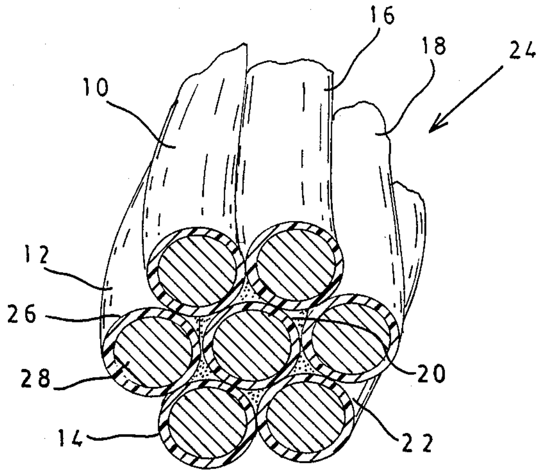
FIG. 1 is a fragmentary cross-sectional drawing of a cable formed by the twisting of a plurality of superconductor wires.

Referring first to FIG. 1, a plurality of superconductor wires 10, 12, 14, 16, 18, 20, 22 are first twisted to form a cable 24. Each of the wires, e.g. 10, is typically 0.004 in. in diameter and each has an electrical insulating sheath 26 covering a strand (or strands) 28 of the superconductor such as niobium-titanium alloy. When seven wires are utilized as shown, the cable has a diameter of, for example 0.015 in. The strands 28 of superconductor material usually have a conductive cover (not shown), e.g. copper, which is then covered with the insulating sheath 26. This construction is well known by persons skilled in the art. A typically superconductor wire of this construction is that manufactured by Supercon, Inc., Shrewsbury, Mass. The degree of twist of the wires forming the cable is not critical to the construction as long as a wire periodically occupies a different radial position within the cable. Using this winding method, not only is winding ease facilitated due to fewer turns of cable being required, but winding reliability is increased since the cable being wound is much stronger than any single wire. By using this winding method, the only limitation seen to making lower and lower current magnets becomes the limitations associated with the manufacture of the superconducting wire itself.

Figure 2:
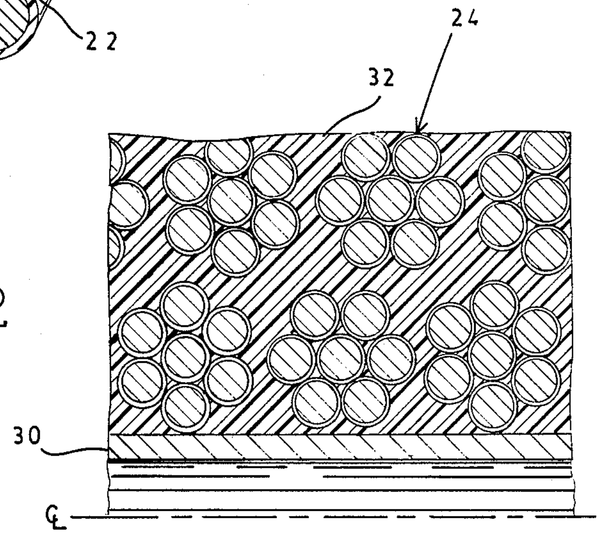
FIG. 2 is a fragmentary cross sectional drawing of a portion of a magnet wound, for example, spirally on a cylindrical structure showing all interstices filled with a suitable potting material thus illustrating the parallel paths for heat dissipation within the magnet.

As illustrated in FIG. 2, the cable is wound upon a suitable surface or "mandrel", in this case a cylindrical tube 30. Other configurations of a mandrel would be used to establish a desired configuration for the finished magnet. As the cable is wound in abutting relationship to previous turns, a suitable "potting" material 32 is applied such as a curable epoxy. Typically this epoxy can be "Stycast" as manufactured by Emerson and Cumming. In this manner all interstices between turns of the cable and, all, or essentially all, interstices between wires of the cable are completely filled with the epoxy. In this manner there can be no movement of the wires during operation of the magnet. Furthermore, the epoxy forms a good thermal path between wires so as to provide plural and parallel paths for the dissipation of heat as such is generated at any location within the magnet. During the winding opposite ends of the cable are brought to a common location whereby interconnecting of the wires serially is easily accomplished. It will be understood by those skilled in the art that the magnet is completely immersed in a cryogenic fluid, such as liquid helium, during operation. This cryogenic fluid then receives any heat dissipated from the wires via the epoxy.

Figure 3:
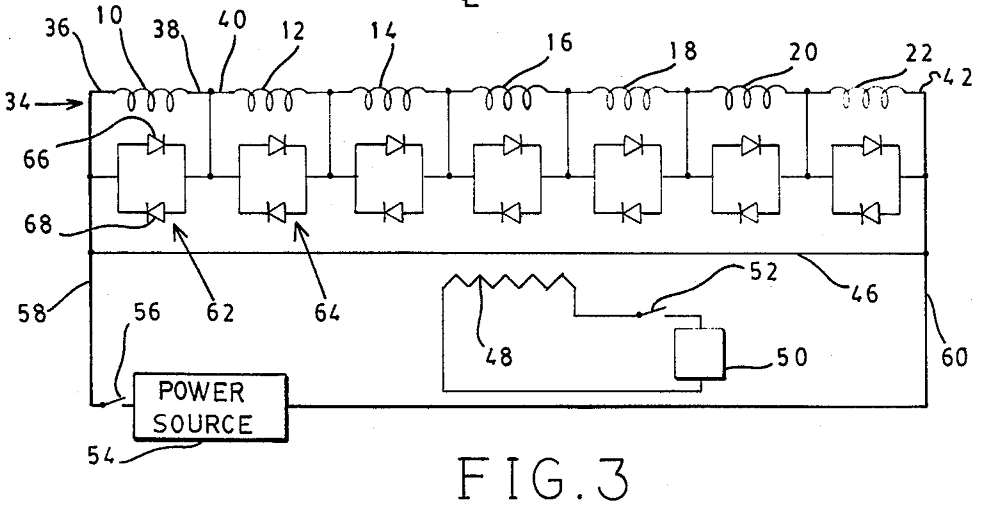
FIG. 3 is a schematic drawing illustrating a typical magnet wherein each "coil" of the magnet is provided with a voltage spike limiting device.

A schematic diagram of the magnet system showing the voltage surge (spike) protection of the present invention is illustrated in FIG. 3. As illustrated, the magnet 34 has seven winding segments corresponding to the seven wires of the cable. For example, a first end 36 of wire 10 is used to introduce current to the magnet. The second end 38 of wire 10 is joined to a first end 40 of wire 12, with the other wires serially joined as shown. The second end 42 of wire 22 forms the second lead to the magnet. This magnet has a typical persistant switch 44 made up of a shunt 46, a heater 48, a power supply 50 and a switch 52. This construction will be known to those versed in the art and will take on a configuration desired by user of the magnet. Furthermore, the magnet 34 is initially "charged" by a conventional power source 54, having an appropriate switch 56, with the leads 58 and 60 supplying the magnet. Operation of the magnet during the charging thereof also will be known by persons skilled in the art.

When a quench occures, a voltage spike occurs that is proportional to the inductance of the winding and the rate of change of current through the winding. This voltage surge can be very damaging to wires of the magnet since it can be of the order of several thousand volts.

Voltage surge protection is accomplished according to the present invention by "shunting" each of the winding segments (wires) with a voltage limiting device such as at 62 and 64. Due to the proximity of the various ends of the wire, these protection devices are easily introduced into the circuit. In the embodiment illustrated, the voltage limiting device is a pair of back-to-back diodes, e.g. 66, 68. Typically these can be type MR-751 as manufactured by Motorola. For some applications a resistor across each winding segment (wire) in place of the diodes will accomplish sufficient voltage limiting to prevent damage to the wires during a quench. For this a cryogenically rated resistor of about one ohm can be used. Diodes, however result in a lower energy loss than the resistors.

A magnet was constructed according to the method of the present invention. The individual wires were 0.004 in. in diameter forming a cable of 0.015 in. in diameter. The magnet had about 1,150 turns of the cable thus resulting in about 8,050 turns of wire and 2.42 henries of inductance. The cable was covered with the afore-mentioned epoxy during winding of the magnet. The diode voltage surge protection of FIG. 3 was employed. This magnet was operated at eleven amperes to produce a magnetic field of over one tesla. The magnet was intentionally quenched several times and no dileterious damage occurred.

From the foregoing it will be understood that a method for producing a low current (less than about ten amperes), high magnetic field superconducting magnet has been developed that provides for protection against damage due to a quench of the magnet. This low current magnet reduces magnet weight, simplifies control electronics and significantly reduces the heat load into the cryogenic environment. Although certain specific parameters are described relative to this method, and the magnet produced thereby, these parameters are not given as a limitation to the invention. Rather, the invention is to be limited only by the scope of the appended claims and their equivalents when read in conjunction with the detailed description and the drawings.

We claim:

1. A method of producing a low current superconducting magnet having protection against quench damage, which comprises:

twisting a plurality of substantial equal length superconductor wires of a size to carry said low current into a cable, said wires being electrically insulated from each other;

winding said cable into a selected configuration to produce a superconductor magnet winding;

simultaneously with said winding of said cable, fully filling intertices between said cable windings with a settable potting mixture;

joining ends of said wires in said cable in series whereby each wire forms one winding segment of said magnet winding; and connecting a voltage limiting device across each said winding segment of said magnet winding.

2. The method of claim 1 wherein said voltage limiting device is a pair of diodes connecting in a back-to-back array.

3. The method of claim 1 wherein said voltage limiting device is a resistor.

4. The method of claim 1 wherein said potting material is an epoxy having a high thermal conductivity.

5. The method of claim 1 wherein said superconductor wire is a niobium-titanium alloy having an electrical insulating coating, said wires being about 0.004 in. in diameter.

6. The method of claim 5 wherein seven superconductor wires are twisted to form said cable, said cable being about 0.015 in. in diameter.

7. A method of producing a low current superconducting magnet having protection against quench damage, which comprises:

twisting seven substantially equal length superconductor wires of about 0.004 in. diameter into a cable, said superconductor wires being a niobium-titanium alloy having an electrical insulator coating so as to insulate each wire from each other wire;

winding said cable onto a surface to form a magnet winding of a selected configuration, individual windings of said cable being proximate at least one other winding of said cable;

applying a settable epoxy to said surface and to said cable during said winding of said cable to substantially fill interstices between adjacent windings of said cable and between said windings of said cable and said surface, said epoxy providing thermal conductivity between said cable windings and an exterior of said magnet winding;

joining ends of said superconductor wires in said cable in series whereby each wire forms one winding segment of said magnet winding; and connecting a voltage limiting device across each said winding segment of said magnet winding, said voltage limiting device being a pair of diodes connected in a back-to-back array.

8. A magnet for use as a low current superconducting magnet, which comprises:

a plurality of superconductor wires, each electrically insulated from each other, and twisted into a cable, said cable wound in adjacent turns upon a surface to form a magnet winding of a selected configuration, with ends of said wires joined to put said wires in electrical series and to form winding segments of said magnet winding;

a thermally conductive epoxy filling interstices between said adjacent turns of said cable and between said cable and said surface, said epoxy and said array of superconductor wires providing parallel paths for dissipation of heat to prevent thermal damage during quench of said magnet; and a voltage limiting device across each of said winding segments to prevent damage to said winding segments by voltage excursions during quench of said magnet.

9. The superconducting magnet of claim 8 wherein said voltage limiting device is a pair of diodes connected in a back-to-back array across each said winding segment.

10. The superconducting magnet of claim 8 wherein said voltage limit is a resistor connected across each said winding segment.

11. The superconducting magnet of claim 8 wherein seven of said superconducting wires are twisted to form said cable said superconductor wires being fabricated of a niobium-titanium alloy and are about 0.004 in. in diameter and said cable is about 0.015 in. in diameter.

12. The superconducting magnet of claim 11 wherein said cable is wound in 1,150 turns to produce 2.42 henries of inductance.

13. The superconducting magnet of claim 11 wherein about eleven amperes of current flowing through said winding produces a magnetic field of over one tesla.

* * * * *